US009196395B2

United States Patent
Kitano

(10) Patent No.: US 9,196,395 B2
(45) Date of Patent: Nov. 24, 2015

(54) CONDUCTIVE MEMBER AND METHOD FOR PRODUCING SAME

(75) Inventor: Hiroki Kitano, Nagoya (JP)

(73) Assignee: Kitagawa Industries Co., Ltd., Inazawa-shi, Aichi (JP)

( * ) Notice: Subject to any disclaimer, the term of this patent is extended or adjusted under 35 U.S.C. 154(b) by 323 days.

(21) Appl. No.: 13/882,898

(22) PCT Filed: Nov. 11, 2011

(86) PCT No.: PCT/JP2011/076098
§ 371 (c)(1),
(2), (4) Date: May 1, 2013

(87) PCT Pub. No.: WO2012/063941
PCT Pub. Date: May 18, 2012

(65) Prior Publication Data
US 2013/0220678 A1    Aug. 29, 2013

(51) Int. Cl.
*H05K 9/00*    (2006.01)
*H01B 7/04*    (2006.01)
*H01R 13/24*   (2006.01)

(52) U.S. Cl.
CPC .............. *H01B 7/04* (2013.01); *H05K 9/0015* (2013.01); *H01R 13/2414* (2013.01)

(58) Field of Classification Search
CPC ..... H05K 9/00; H05K 9/0009; H05K 9/0015; H05K 9/0016; H01B 7/04; H01R 13/2414
See application file for complete search history.

(56) References Cited

U.S. PATENT DOCUMENTS

| 3,530,033 | A | * | 9/1970 | Hildebrandt .................. 428/594 |
| 4,330,165 | A | * | 5/1982 | Sado .............................. 439/91 |
| 4,839,227 | A | * | 6/1989 | Hoopman ..................... 428/343 |
| 4,864,076 | A |   | 9/1989 | Stickney |
| 6,146,151 | A | * | 11/2000 | Li ..................................... 439/66 |
| 6,456,504 | B1 | * | 9/2002 | LoForte et al. ............... 361/799 |
| D525,207 | S | * | 7/2006 | Kister et al. ................. D13/154 |
| 2004/0175972 | A1 |   | 9/2004 | Kawai |
| 2006/0180347 | A1 |   | 8/2006 | Van Haaster |
| 2009/0061683 | A1 | * | 3/2009 | Ball et al. ..................... 439/607 |
| 2009/0305579 | A1 | * | 12/2009 | Silva et al. .................... 439/816 |

FOREIGN PATENT DOCUMENTS

| JP | 5442/1965 | 6/1962 |
| JP | 41268/1982 | 8/1980 |

(Continued)

OTHER PUBLICATIONS

International Search report for corresponding PCT/JP2011/076098 mailed on Jan. 24, 2012.
International Preliminary Report on Patentability for corresponding PCT/JP2011/076098 mailed May 16, 2013.

(Continued)

*Primary Examiner* — Steven T Sawyer
(74) *Attorney, Agent, or Firm* — Davis & Bujold, P.L.L.C.; Michael J. Bujold

(57) ABSTRACT

A conductive member includes a metal part and an elastomer part. The conductive member is configured such that, when the conductive member is interposed between a first member and a second member, the elastomer part is elastically deformed so that a top end portion of at least one upper surface-side convex part in the metal part is pressed toward a side of the second member, and a top end portion of at least one under surface-side convex part in the metal part is pressed toward a side of the first member.

9 Claims, 5 Drawing Sheets

(56) References Cited

FOREIGN PATENT DOCUMENTS

| | | |
|---|---|---|
| JP | S57041268 U | 3/1982 |
| JP | H-2156599 | 6/1990 |
| JP | H-0897585 | 4/1996 |
| JP | H-08293340 | 11/1996 |
| JP | H-09115574 | 5/1997 |
| JP | 2002 075 567 | 3/2002 |
| JP | 2003 031 984 | 1/2003 |
| JP | 2004 297 037 | 10/2004 |
| JP | 2008 123 850 | 5/2008 |
| JP | 2008 529 299 | 7/2008 |

OTHER PUBLICATIONS

Japanese Notice of Reason(s) for Rejection issued in corresponding Japanese Application No. 2010-253010 mailed Sep. 9, 2014.
English translation of the relevant portion of Unexamined Japanese Utility Model Application Publication No. S57 (1982)-41268.
Chinese Office Action issued in corresponding Chinese Patent Application No. 201180054289.X mailed Jan. 22, 2015. (Chinese Office Action—8 Pages, Brief Summary of the Office Action—2 Pages).
Japanese Decision of Rejection issued in corresponding Japanese Patent Application No. 2010-253010 mailed Feb. 10, 2015.

* cited by examiner

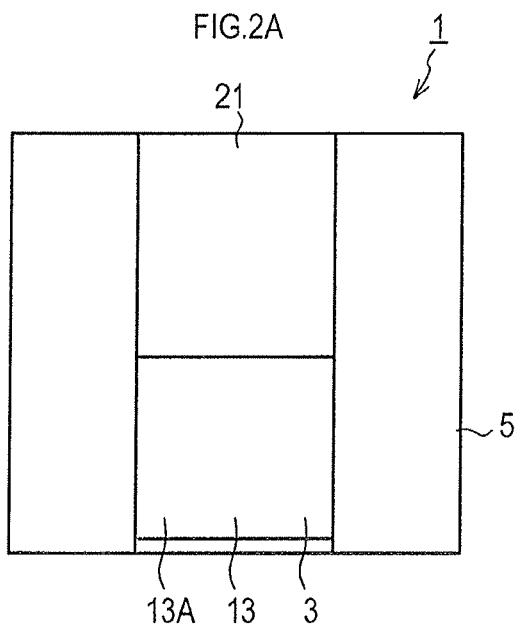
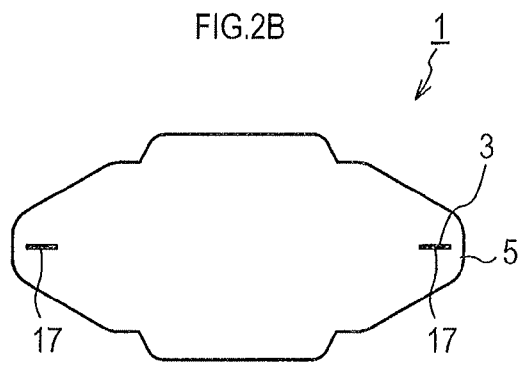
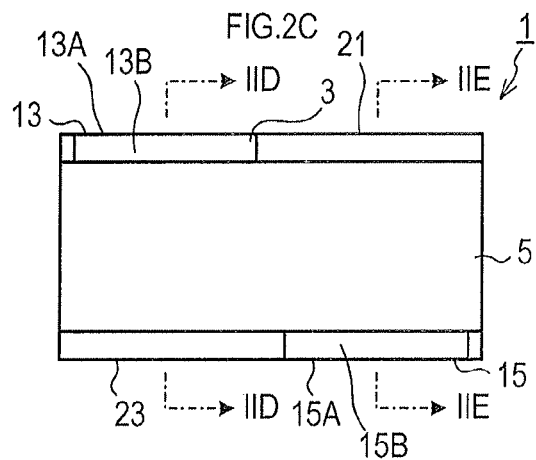
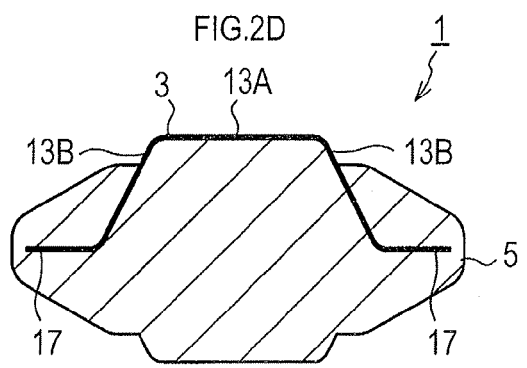
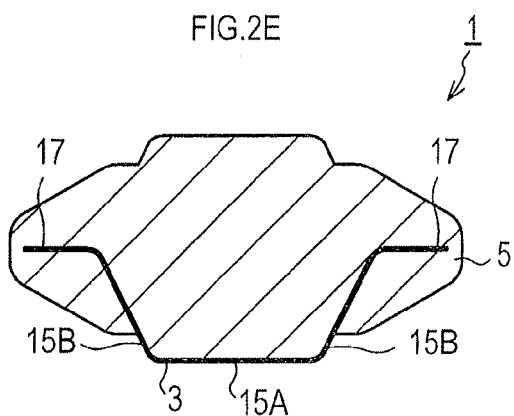

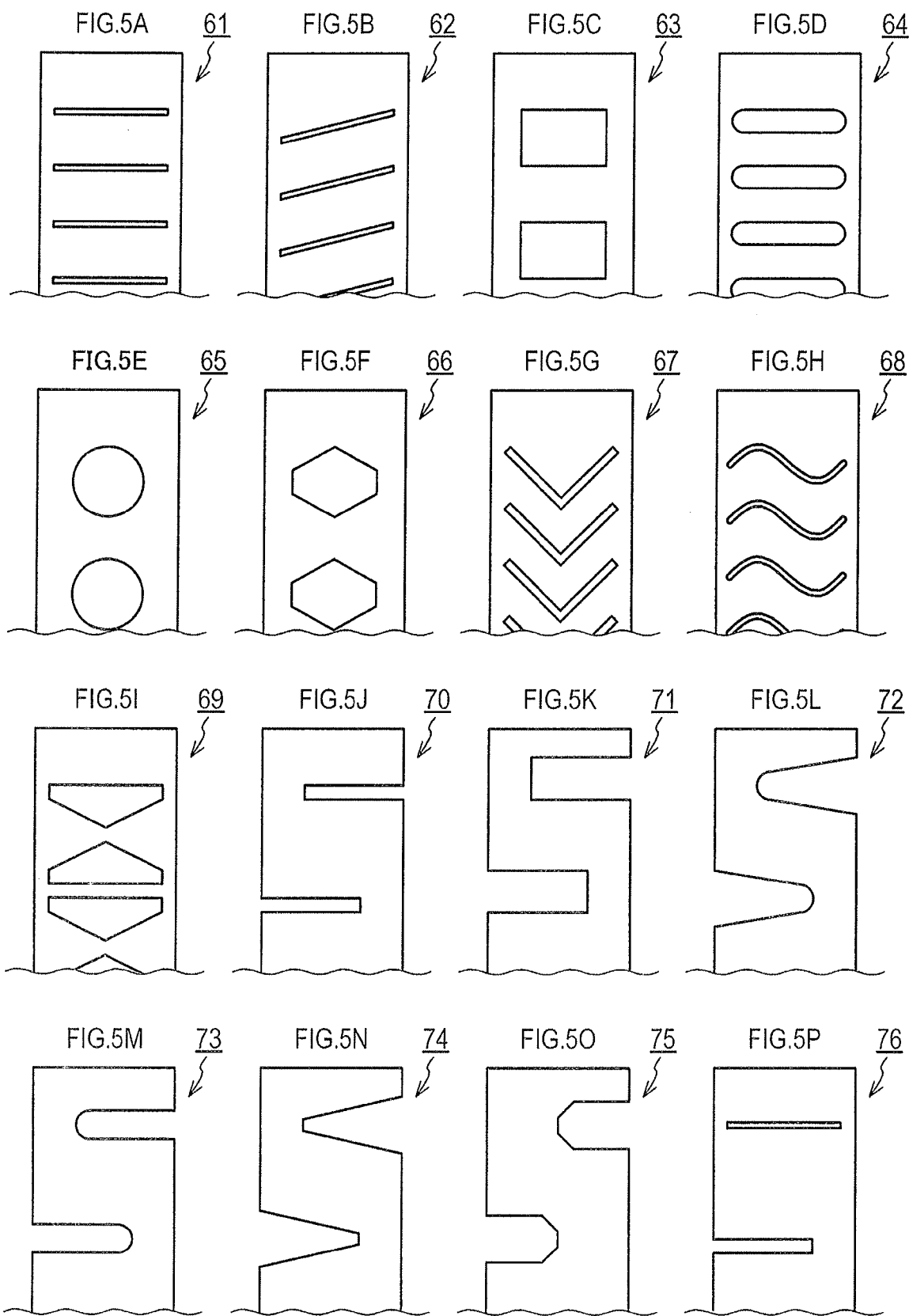

CONDUCTIVE MEMBER AND METHOD FOR PRODUCING SAME

CROSS-REFERENCE TO RELATED APPLICATIONS

This international application claims the benefit of Japanese Patent Application No. 2010-253010 filed on Nov. 11, 2010 in the Japan Patent Office, and the entire disclosure of Japanese Patent Application No. 2010-253010 is incorporated herein by reference.

TECHNICAL FIELD

The present invention relates to a conductive member that is interposed between a first member and a second member to electrically connect the first member and the second member to each other.

BACKGROUND ART

As a conductive member that is interposed between a first member and a second member to electrically connect the first member and the second member to each other, the following conductive member is known: the conductive member is soldered to the first member and disposed so as to be brought into contact with the second member, thereby forming a conductive path between these two members.

A representative example of the aforementioned conductive member may include, for example, a conductive member formed by bending a component that has been punched out of a thin metallic plate (see Patent Document 1, for example). A metal plate member of this type is generally formed of a metallic material having a spring characteristic. Such a metal plate member is, for example, surface-mounted on a printed wiring board as a first member and used to provide electrical conduction between the first member, and a second member such as another printed wiring board, a shield board, or a chassis.

Moreover, as a conductive member having a different configuration from a configuration of such a surface-mount component described above, there has been a known conductive member constituted to have a more elongated shape. A representative example of this conductive member may include a conductive member to be used as a gasket for electromagnetic shielding that inhibits leakage or entry of electromagnetic waves from a clearance between the first member and the second member (see Patent Document 2, for example).

Such a gasket for electromagnetic shielding is, for example, configured to be an elongated member in which a unit structure is repeatedly formed in one axial direction; this gasket for electromagnetic shielding is also formed of a metallic material having a spring characteristic.

PRIOR ART DOCUMENTS

Patent Documents

Patent Document 1: Japanese Unexamined Patent Application Publication No. 9-115574
Patent Document 2: Japanese Unexamined Patent Application Publication No. 2003-31984

SUMMARY OF THE INVENTION

Problems to be Solved by the Invention

Since a mobile device such as a cellular phone has been significantly reduced in size and weight, a clearance between a printed wiring board and a housing has become extremely small. Therefore, when electrically connecting the printed wiring board and the housing by arranging a conductive member in such a clearance, an extremely small conductive member, especially, a low-profile conductive member with an extremely small size in the height direction, is required.

However, there is a conductive member having a structure with a spring portion formed by folding back a metal plate, as in the conductive member described in the above Patent Document 1; if this conductive member is processed to have an extremely small size in the height direction, the spring portion has to be folded back in an excessively small radius of curvature when the spring portion is folded back into an approximately V-shape relative to a solder bonding portion. Therefore, in this conductive member, the spring portion has a tendency to easily break at the folded-back part when the spring portion is folded back excessively as above.

Furthermore, there is a conductive member having the following configuration: instead of folding back the metal plate into an approximately V-shape in such a manner that a valley-folded portion of the folded-back part makes an acute angle as described above, in some structures, part of the metal plate is cut and raised in such a manner that a valley-folded portion of the folded-back part makes an obtuse angle, and the cut-and-raised part is brought into contact with other portions. However, since such a cut-and-raised spring has a poor spring characteristic and is not excellent in resilience, a very big stroke cannot be secured, and a problem thereby arises in that it is difficult to secure a sufficiently high contact pressure.

Moreover, in the gasket for electromagnetic shielding described in the above Patent Document 2, size reduction thereof can be only achieved within a range in which the spring characteristic of the metallic material can be ensured. Accordingly, there has been a problem in which it is not easy to constitute a gasket which has an extremely small size in the height direction and the width direction.

Meanwhile, other than the conductive member made of metal described as above, there has been proposed a conductive member that is configured such that, for example, a conductive cloth or a conductive film is wound around an elastic body as a core member. However, the conductive member having such a configuration is in a state where an entire circumference of the elastic body is restricted by the conductive cloth or the conductive film. Accordingly, if the conductive member of this type is interposed between two members, there is no space for such a deformed elastic body to extend and therefore it is likely that a pressure acting to the conductive cloth or the conductive film from this elastic body increases excessively. Thus, there has been a problem in which an excessively large load is applied to the conductive cloth or the conductive film.

The present invention has been made to solve the foregoing problems. An object of the present invention is to provide a conductive member that can exhibit a sufficiently high contact pressure even if the conductive member is small-sized and that can inhibit an excessively large load from being applied to a conductive part when the conductive member is interposed between two members.

Means for Solving the Problems

Hereinafter, configurations adopted in the present invention are described.

A conductive member according to a first aspect of the present invention includes a metal part and an elastomer part. The metal part is formed of a planar body of a metallic material. The metal part includes: at least one upper surface-side convex part formed in the planar body so as to protrude toward a side of an upper surface of the planar body; and at least one under surface-side convex part formed in the planar body so as to protrude toward a side of an under surface of the planar body. The at least one upper surface-side convex part is formed in such a manner that at least one of at least one through hole and at least one notch is formed in the planar body, a pair of portions of the planar body are respectively located on both sides where the at least one of the at least one through hole and the at least one notch is located therebetween, and one of the pair of portions is bent in a protruding manner toward the side of the upper surface of the planar body. The at least one under surface-side convex part is formed in such a manner that the other of the pair of portions of the planar body is bent in a protruding manner toward the side of the under surface of the planar body. The elastomer part includes an elastomeric material and is configured to bury therein the metal part in a state where a top end portion of the at least one upper surface-side convex part and a top end portion of the at least one under surface-side convex part are exposed to an outside of the elastomer part. The conductive member is configured such that, in a state where the conductive member is oriented such that the top end portion of the at least one upper surface-side convex part is brought into contact with a first member of a pair of members between which the conductive member is to be clamped and that the top end portion of the at least one under surface-side convex part is brought into contact with a second member of the pair of members, when the conductive member is interposed between the first member and the second member, the elastomer part is elastically deformed so that the top end portion of the at least one upper surface-side convex part is pressed toward a side of the second member and the top end portion of the at least one under surface-side convex part is pressed toward a side of the first member.

In the conductive member configured as above, one of the at least one upper surface-side convex part and the at least one under surface-side convex part is soldered to one of the first member and the second member, and the other of the at least one upper surface-side convex part and the at least one under surface-side convex part is disposed so as to be brought into contact with the other of the first member and the second member. Alternatively, each of the at least one upper surface-side convex part and the at least one under surface-side convex part is disposed so as to be brought into contact with either one of the first member and the second member. That is to say, this conductive member can be soldered to a position at which the conductive member is to be disposed, or can be disposed without being soldered.

If such a conductive member is interposed between the first member and the second member, as a result of elastic deformation of the elastomer part, the top end portion of the at least one upper surface-side convex part provided in the metal part is pressed toward the side of the second member, and the top end portion of the at least one under surface-side convex part provided in the metal part is pressed toward the side of the first member.

Accordingly, the following state is achieved: at a position at which the at least one upper surface-side convex part is disposed to be in contact with the first member, the at least one upper surface-side convex part is pressure-contacted to the first member with an appropriate contact pressure; and at a position at which the at least one under surface-side convex part is disposed to be in contact with the second member, the at least one under surface-side convex part is pressure-contacted to the second member with an appropriate contact pressure. Therefore, unlike a conductive member utilizing a metal spring, even if the conductive member of the present invention is downsized, the conductive member of the present invention can exhibit a sufficiently high contact pressure.

Moreover, the at least one upper surface-side convex part is formed in such a manner that the at least one of the at least one through hole and the at least one notch is formed in the planar body of the metallic material, the pair of portions of the planar body are respectively located on the both sides where the at least one of the at least one through hole and the at least one notch is located therebetween, and the one of the pair of portions is bent in a protruding manner toward the side of the upper surface of the planar body; and the at least one under surface-side convex part is formed in such a manner that the other of the pair of portions of the planar body is bent in a protruding manner toward the side of the under surface of the planar body.

Therefore, it is structured such that metallic portions exist in a protruding direction of each of the convex parts, while the metallic portions do not exist in a direction opposite to each of the protruding directions. Thus, the elastomer part, which is to be elastically deformed when the at least one upper surface-side convex part is pressure-contacted to the first member and the at least one under surface-side convex part is pressure-contacted to the second member, can be relatively freely deformed at a side opposite to the protruding direction of each of the convex parts.

Therefore, unlike the conductive member in which an entire circumference of the elastomer part is restricted by the conductive cloth or the conductive film, it is possible to suppress an excessive pressure from the elastomer part from being applied to an inside of each of the convex parts. Moreover, it is possible to achieve deformation with a favorable followability to contact areas in the first member and the second member.

In constituting the above-described conductive member, various metals with excellent electrical conductivity can be used as the metallic material constituting the metal part; for example, gold, silver, copper, aluminium, other various alloys (e.g., stainless, phosphor bronze, beryllium copper, etc.) can be used. Although as such metallic materials, a metallic material having higher electrical conductivity is preferred when only considering performance thereof, a conductive member that is preferable when also considering costs, etc., may be chosen as needed.

As the elastomeric material, for example, various rubbers, thermoplastic elastomer having rubber elasticity, a gel having a three-dimensional net-like structure in which multiple polymers' molecules partially bonded to one another due to bonding of specific portions in chains, and so on may be used.

Examples of the above-mentioned rubbers are natural rubber, isoprene rubber, butadiene styrene rubber, butadiene-acrylonitrile rubber, butyl rubber, chloroprene rubber, ethylene-vinyl acetate rubber, polysulfide rubber, urethane rubber, ethylene propylene rubber, ethylene-propylene terpolymer, gutta-percha, chlorosulfonated polyethylene, silicone rubber, butadiene rubber, fluorocarbon rubber, polyisobutylene, acrylic rubber, and so on.

Examples of the above-mentioned thermoplastic elastomer are styrene block copolymer (SBC), thermo polyolefin (TPO), thermoplastic polyurethane (TPU), thermoplastic elastomer vulcanizates (TPV), and so on.

The aforementioned gel is preferably a gel in a state in which fluidity has been lost by containing a softening agent (e.g., oil component) in gaps in the net-like structure of a base polymer having a three-dimensional net-like structure.

Examples of the above-mentioned base polymer are various thermoplastic elastomers of a styrene system, such as Styrene-Isoprene-Styrene system (SIS system), Styrene-Ethylene-Propylene-Styrene system (SEPS system), Styrene-Ethylene-Butadiene-Styrene system (SEBS system), olefin system, ester system, amid system, urethane system, or the like, as well as modifications of these systems, for example, by addition of water. Alternatively, the examples of the base polymer are thermoplastic resins of styrene system, ABS system, olefin system, vinyl chloride system, acrylic system, carbonate system, acetal system, nylon system, halogenated olefin system (tetrafluoroethylene system, fluoro-chloroethylene system, fluoroethylene-propylene system, or the like), cellulose system (such as ethyl cellulose system), as well as rubber modifications of these resins. These various thermoplastic resins may be used alone or by blending two of more of them together.

Examples of the softening agent include various softening agents for rubber or resin, such as mineral oil-based, vegetable-oil-based, and synthetic oil-based softening agents. Examples of the mineral oil-based softening agent include process oils such as paraffinic, naphthenic, and aromatic process oils. Examples of the vegetable oil-based softening agent include castor oil, cottonseed oil, linseed oil, rapeseed oil, soybean oil, palm oil, coconut oil, arachis oil, vegetable wax, pine oil, olive oil, and so on. These softening agents may be used alone or by blending two or more of the softening agents that have good compatibility with each other. Here, hardness of the gel is decreased as an added amount of a softening agent is increased. Therefore, the added amount may be adjusted to achieve a desired hardness of the gel.

Besides the base polymer and the softening agent, additives such as a known resin component may also be used, in order to improve various properties. Examples of the resin component that may be used include polyolefin resin and polystyrene resin. Addition of these components will lead to an improved processability or heat resistance. Examples of the polyolefin resin include: copolymers of polyethylene, isotactic polypropylene or propylene, and a small amount of α-olefin (e.g., propylene-ethylene copolymer, propylene/4-methyl-1-pentene copolymer); poly (4-methyl-1-pentene); polybutene-1, etc.

Furthermore, other than the above-mentioned additives, the following additives can be used as needed: antibacterial agents; hindered amine light stabilizers; ultraviolet absorbers; antioxidants; inorganic fillers; coloring agents; silicone oils; coumarone resins; coumarone-indene resins; phenolic terpene resins; petroleum hydrocarbons; and various tacking agents (tackifiers), such as rosin derivatives.

To constitute a conductive member that can be surface-mounted by reflow soldering, the elastomeric material is required to be a material having a physical property capable of withstanding a reflow process. In implementation, from the above-mentioned rubber, elastomer, gel, etc., a material capable of withstanding a reflow process may be selected and used. A heat-resistance condition required in the reflow process can be set in any manner; however, one example of a general condition may include, for example, a condition of 240° C. or less and 5 seconds or less.

In the conductive member of the present invention, the at least one upper surface-side convex part and the at least one under surface-side convex part may be provided to be aligned in one line when viewed from a direction perpendicular to the upper surface and the under surface of the planar body.

In the above-constituted conductive member, since the at least one upper surface-side convex part and the at least one under surface-side convex part are aligned in one line, the conductive member is configured to be a linear conductive member with a length corresponding to a number of the convex parts. Accordingly, if the number of the convex parts is smaller, the conductive member can be used as a conductive member for automatic mounting. Alternatively, if the number of the convex parts is sufficiently large, it is possible to constitute a conductive member to be used as a conductive gasket.

In the conductive member of the present invention, the at least one through hole may be formed in the planar body. Portions of the planar body, except for the at least one upper surface-side convex part and the at least one under surface-side convex part, may form a pair of continuous parts; the pair of continuous parts are continuous with the at least one upper surface-side convex part and the at least one under surface-side convex part at both ends of the planar body in a direction intersecting an alignment direction of the at least one upper surface-side convex part and the at least one under surface-side convex part.

In the conductive member constituted as above, even if a force that pulls the conductive member toward a line-up direction of the at least one upper surface-side convex part and the at least one under surface-side convex part is applied to the conductive member, a width of the through hole does not expand as long as at least one of the pair of continuous parts does not break. Thus, it is possible to suppress the conductive member from being separated at an area of the through hole.

The conductive member of the present invention may be configured such that when the conductive member is interposed between the first member and the second member, the pair of continuous parts move in a direction away from each other in accordance with deformation of the metal part and the elastomer part.

In the conductive member constituted as above, when the pair of continuous parts move in the direction away from each other, a form of the metal part becomes closer to a form of the planar body before the at least one upper surface-side convex part and the at least one under surface-side convex part are formed. Consequently, an amount of modification of the metal part is decreased. Thus, compared with a case in which the amount of modification of the metal part increases, it is possible to reduce a load applied to the metal part.

In the conductive member of the present invention, the metal part may be made of a metallic foil; the metallic foil is plastically-deformed in accordance with a form of the elastomer part when the elastomer part interposed between the first member and the second member is elastically deformed.

In the conductive member constituted as above, since the metal part is made of the metallic foil that is plastically deformed in accordance with the form of the elastomer part, it is difficult to make the metal part itself have a spring characteristic. However, as a result of the elastomer part that has been elastically deformed, the metal part made of the metallic foil is plastically deformed in accordance with the form of the elastomer part. Therefore, if the conductive member is constituted as above, it is not necessary to form the metal part with a metallic material having an excellent mechanical strength in which a spring characteristic can be exhibited. Consequently, it is possible to achieve size reduction of the conductive member very easily, and such a conductive member is preferable to constitute a low-profile automatic mounting component or a low-profile electroconductive gasket.

In the conductive member of the present invention, each of the top end portion of the at least one upper surface-side convex part and the top end portion of the at least one under surface-side convex part may be provided with a metallic flat-surface portion formed in a flat shape. Moreover, the metallic flat-surface portion of the at least one upper surface-side convex part and the metallic flat-surface portion of the at least one under surface-side convex part may be parallel to each other.

In the conductive member constituted as above, the metallic flat-surface portion at a top end portion of the at least one upper surface-side convex part and the metallic flat-surface portion at a top end portion of the at least one under surface-side convex part are parallel to each other. Therefore, when the conductive member is interposed between a pair of surfaces parallel to each other, the conductive member can be appropriately in contact with both of the pair of the surfaces parallel to each other.

Moreover, if the conductive member is constituted as an automatic mounting component, one of the metallic flat-surface portion at the top end portion of the convex part located at the upper surface side and the metallic flat-surface portion at the top end portion of the convex part located at the under surface side can be used as a solder joint surface, and the other of the aforementioned metallic flat-surface portions can be used as a suction surface to be attracted by means of a suction nozzle of an automatic mounting device.

In the conductive member of the present invention, the elastomer part may be provided with at least one elastomer flat-surface portion such that the at least one elastomer flat-surface portion is located on a same plane as a plane of one of the metallic flat-surface portion of the at least one upper surface-side convex part and the metallic flat-surface portion of the at least one under surface-side convex part.

In the conductive member constituted as above, in a case where the conductive member is arranged at a predetermined arrangement position, when at least one of the metallic flat-surface portion of the at least one upper surface-side convex part and the metallic flat-surface portion of the at least one under surface-side convex part is brought into contact with the arrangement position, not only the at least one of the metallic flat-surface portion of the at least one upper surface-side convex part and the metallic flat-surface portion of the at least one under surface-side convex part, but also the at least one elastomer flat-surface portion is brought into contact with the arrangement position. For this reason, since the elastomer flat-surface portion has a surface friction resistance greater than the surface friction resistances of these metallic flat-surface portions, this elastomer flat-surface portion functions as a slip prevention.

Therefore, such a conductive member can suppress change of an orientation of the conductive member due to receipt of a very small external force. For this reason, the above-constituted conductive member may be preferable as a small-sized automatic surface mounting component. Moreover, if this conductive member is configured to be an elongated electroconductive gasket, it is possible to suppress a positional disposition during disposing work, compared with the conductive member made of metal. Therefore, the above-constituted conductive member can be an electroconductive gasket having an excellent workability.

In the conductive member of the present invention, at least one of the at least one upper surface-side convex part and the at least one under surface-side convex part may be formed to include a pair of side portions formed continuously with positions on both sides where the metallic flat-surface portion of at least one of the at least one upper surface-side convex part and the at least one under surface-side convex part is located therebetween. The pair of side portions may be configured such that a part of the pair of side portions, the part being continuous with the metallic flat-surface portion, is exposed to the outside of the elastomer part, while the rest of the pair of side portions are buried in an inside of the elastomer part.

According to the conductive member constituted as above, the pair of side portions are formed continuously with the positions on the both sides between which the metallic flat-surface portion is interposed, and the part of the pair of side portions is exposed to the outside of the elastomer part. Therefore, when soldering is performed to the convex part provided with the pair of side portions, a solder fillet is formed in the pair of side portions. Furthermore, in this pair of side portions, an exposed range of the part exposed to the outside of the elastomer part can be adjusted to a desired range, and therefore, adjustment can be made to an extent that soldering does not excessively expand.

Consequently, the conductive member constituted as above can provide an improved bonding strength at a position to which soldering is performed, compared with the conductive member in which a solder fillet will not be formed. Moreover, unlike the conductive member in which a relatively large solder fillet is formed due to excessive expansion of solder, the following would not occur: as the solder fillet having excellent stiffness is formed, elasticity of the conductive member is impaired. Therefore, especially, in the small-sized conductive member, it is possible to perform adjustment such that a solder fillet having an optimal size corresponding to a size of the conductive member can be formed.

A second aspect of the present invention is a method for producing a conductive member; the method includes steps of: forming at least one of at least one through hole and at least one notch in a planar body of a metallic material; forming at least one upper surface-side convex part in such a manner that a pair of portions of the planar body are respectively located on both sides where the at least one of the at least one through hole and the at least one notch is located therebetween, and one of the pair of portions is bent in a protruding manner toward a side of an upper surface of the planar body; forming at least one under surface-side convex part by bending the other of the pair of portions of the planar body in a protruding manner toward a side of an under surface of the planar body; and burying the planar body in an elastomeric material in a state where a top end portion of the at least one upper surface-side convex part and a top end portion of the at least one under surface-side convex part are exposed to an outside of the elastomeric material.

According to the aforementioned method, it is possible to provide a conductive member which can exhibit a sufficiently high contact pressure even if the conductive member is small-sized and which can inhibit an excessive load applied to a conductive portion when the conductive member is interposed between two members.

BRIEF DESCRIPTION OF THE DRAWINGS

FIG. 2A is a plan view of the conductive member, FIG. 2B is a front view of the conductive member, FIG. 2C is a right side view of the conductive member, FIG. 2D is a cross sectional view of the conductive member, taken along line IID-IID, and FIG. 2E is a cross sectional view of the conductive member, taken along line IIE-IIE.

FIGS. 5A-5P are illustrative views showing various forms of through holes and notches.

Figure 1A:
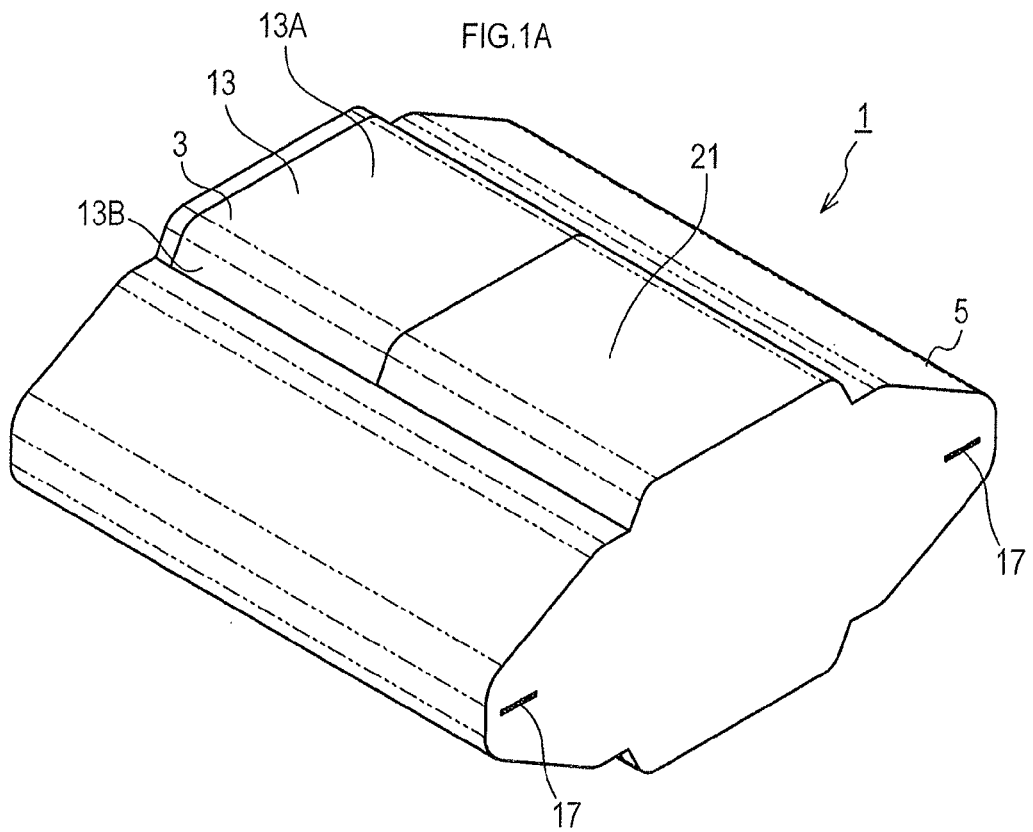
FIG. 1A is a perspective view of a conductive member.

EXPLANATION OF REFERENCE NUMERALS 1,51 . . . conductive member, 3 . . . metal part, 5 . . . elastomer part, 11 . . . through hole, 13,15 . . . convex part, 13A,15A . . . metallic flat-surface portion, 13B,15B . . . side portion, 17 . . . continuous part, 21,23 . . . elastomer flat-surface portion, 31,33 . . . printed wiring board, 61 to 76 . . . metallic foil

MODE FOR CARRYING OUT THE INVENTION

An embodiment of the present invention will be described by way of one example.

A conductive member 1 shown in FIGS. 1A and 1B and FIGS. 2A to 2E is a member that is interposed between two components so as to electrically connect these two components to each other. The conductive member 1 is provided with a metal part 3 formed of a metallic material, and an elastomer part 5 formed of an elastomeric material.

Figure 1B:
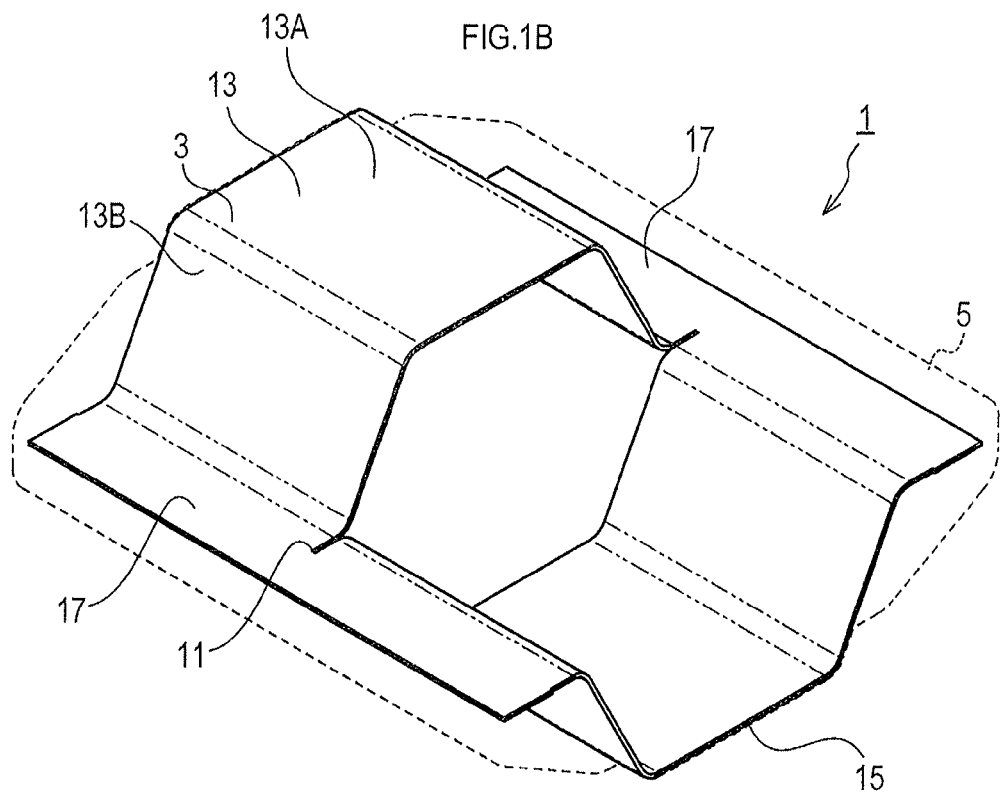
FIG. 1B is a perspective view of a metal part provided in the conductive member.

The metal part 3 is formed such that a metallic foil having a thickness of 0.01 mm is processed into a form as shown in FIG. 1B. A large portion of the metal part 3 is buried in an inside of the elastomer part 5. Only a portion of the metal part 3 is exposed to an outside of the elastomer part 5.

More specifically, in the metal part 3, one slit-like through hole 11 is formed in the metallic foil having a strip shape; convex parts 13 and 15 are provided in such a manner that the through hole 11 is located therebetween. The convex part 13 is formed such that a pair of portions are respectively located on both sides, between which the through hole 11 is located, of the metallic foil, and one of the pair of portions is bent in a protruding manner toward an upper surface side of the metallic foil (see FIGS. 1B and 2D). The convex part 15 is formed in such a manner that the other of the pair of portions is bent in a protruding manner toward an under surface side of the metallic foil (see FIGS. 1B and 2E).

As a result of the aforementioned processing to the metallic foil, the through hole 11 is in an open state to form an opening having a substantially hexagonal shape (see FIG. 1B). In the descriptions hereinafter, in order to provide a simplified explanation of a relative, positional relationship of each part of the conductive member 1, explanations are continued on an assumption that, for descriptive purpose, a protruding direction of the convex part 13 is referred to as "up" and a protruding direction of the convex part 15 is referred to as "down". However, each direction of "up" and "down" shall not mean that in a use state of the conductive member 1, the convex part 13 is to be used while being directed toward "up".

A top end portion of each of the convex parts 13 and 15 is exposed to the outside of the elastomer part 5. More specifically, the convex part 13 includes a metallic flat-surface portion 13A and a pair of side portions 13B; the metallic flat-surface portion 13A is located at an uppermost end of the metal part 3, and the pair of side portions 13B are formed continuously with the metallic flat-surface portion 13A and extend downward. The metallic flat-surface portion 13A and a part at an upper end side in each of the pair of side portions 13B are exposed to the outside of the elastomer part 5, while the rest of the pair of side portions 13B are buried in the inside of the elastomer part 5.

The convex part 15 includes a metallic flat-surface portion 15A and a pair of side portions 15B; the metallic flat-surface portion 15A is located at a lowermost end of the metal part 3, and the pair of side portions 15B are provided continuously with the metallic flat-surface portion 15A and extend upward. The metallic flat-surface portion 15A and a part at a lower end side in each of the pair of side portions 15B are exposed to the outside of the elastomer part 5, while the rest of the pair of side portions 15B are buried in the inside of the elastomer part 5. In the present embodiment, a plane of the metallic flat-surface portion 13A is parallel to a plane of the metallic flat-surface portion 15A; however, the plane of the metallic flat-surface portion 13A may not be parallel to the plane of the metallic flat-surface portion 15A.

In the through hole 11, a contour line thereof is not continuous with a contour line of the metallic foil. That is, the contour line of the through hole 11 is not formed to be a notch shape in which the contour line of the through hole 11 is continuous with the contour line of the metallic foil. By forming the through hole 11 in the above-described form, portions of the metallic foil, except for the pair of portions configured to be the convex parts 13 and 15, form a pair of continuous parts 17. The pair of continuous parts 17 are provided continuously with the convex parts 13 and 15 at respective both sides of the convex parts 13 and 15 aligned in one line when viewed as a planar view. End parts of each of the continuous parts 17 are exposed to the outside of the elastomer part 5.

In the present embodiment, the metal part 3 configured as above is formed by processing the metallic foil inside a mold prepared for forming the elastomer part 5. Specifically, the metallic foil in which the through hole 11 has been formed in advance is disposed in the mold; then, a jig is raised up inside the mold toward the respective protruding directions of the convex parts 13 and 15, thereby pushing out portions to be the convex parts 13 and 15 in the protruding direction by a tip end of the jig.

After the above-described processing of the metallic foil is completed, subsequently, a material composition to be the elastomer part 5 is injected to an inside of the mold. Thereby, the elastomer part 5 is formed. However, it is optional whether to process the metal part 3 in the above-described manner; the metal part 3 may be formed to have a shape similar to a shape of the aforementioned metal part 3 in other manners.

In the elastomer part 5, an elastomer flat-surface portion 21 is formed so as to be located on a same plane as a plane of the metallic flat-surface portion 13A, and an elastomer flat-surface portion 23 is formed so as to be located on a same plane as a plane of the metallic flat-surface portion 15A. Moreover, portions continuous from the elastomer flat-surface portion 21 in the elastomer part 5 are inclined with descending slopes toward edges of the elastomer part 5. This provides a configuration in which worker's fingers are less likely to be caught by the elastomer part 5.

Figure 3:
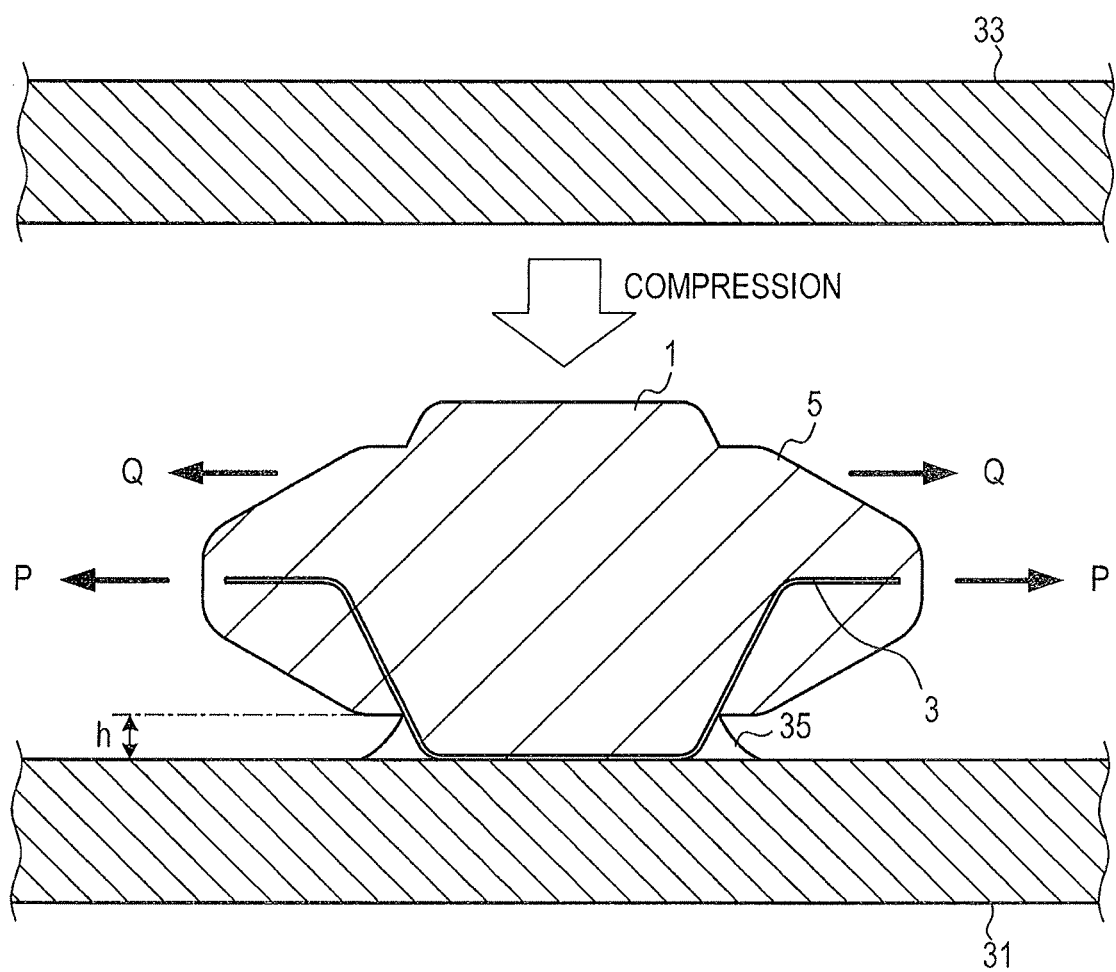
FIG. 3 is an illustrative view showing a use state of the conductive member.

In the conductive member 1 constituted as above, for example, as shown in FIG. 3, the convex part 15 is soldered to a printed wiring board 31, and another printed wiring board 33 is disposed at a position at which the printed wiring board 33 is brought into contact with the convex part 13, thereby allowing electrical connection between the printed wiring board 31 and the printed wiring board 33.

When the conductive member 1 is mounted on the printed wiring board 31, this mounting can be performed, for example, by utilizing an automatic mounting device; in this case, each of the metallic flat-surface portion 13A and the elastomer flat-surface portion 21 can be used as a suction surface for attracting the conductive member 1 by a suction nozzle provided in the automatic mounting device.

Particularly, the elastomer flat-surface portion 21 is made of the elastomeric material and has a high friction coefficient. Therefore, if this elastomer flat-surface portion 21 is used as the suction surface, it is possible to suppress, at a time of moving the conductive member 1 that has been attracted by the suction nozzle, change of an orientation of the conductive member 1 due to receipt of an inertial force, etc.

Meanwhile, the elastomer flat-surface portion 23 functions as a slip prevention when the conductive member 1 is disposed on the printed wiring board 31. Therefore, for example, even if oscillation is transmitted to the printed wiring board 31 during transfer of the conductive member 1 inside a reflow furnace in a state before soldering is completed, it is possible to suppress change of the orientation of the conductive member 1 due to receipt of such an oscillation.

Moreover, when the convex part 15 is soldered to the printed wiring board 31, a height "h" of a portion where a solder fillet 35 is to be formed can be optimized beforehand. Specifically, the height "h" of the portion where the solder fillet 35 is to be formed is made to be a desired height depending on a design of the mold for forming the elastomer part 5.

If this height "h" is excessively small, the solder fillet 35 cannot be formed. Accordingly, solder bonding strength is decreased. On the other hand, if the height "h" is excessively large, a solder wetting amount increases, causing the solder fillet 35 to become larger. Therefore, in a case of the conductive member 1 of a very small size, the conductive member 1 may be buried in the solder fillet 35 more than expected, resulting in deterioration in elasticity of the conductive member 1.

In this regard, in the above-constituted conductive member 1, by providing the elastomer part 5 therein, the height "h" of the portion where the solder fillet 35 is to be formed can be restricted to a position as has been designed. Thus, it is possible to appropriately ensure the elasticity of the conductive member 1, while ensuring an excellent bonding strength.

Furthermore, after completion of the soldering, when the conductive member 1 is interposed between the printed wiring boards 31 and 33, the conductive member 1 is compressed between the printed wiring boards 31 and 33, and is elastically deformed by receiving such a compression force. In this case, if the conductive member 1 is compressed in a direction in which a gap between the printed wiring boards 31 and 33 becomes narrow, the conductive member 1 is deformed so as to expand toward a direction of an arrow P shown in FIG. 3.

In a cross section of the metal part 3 shown in FIG. 3, the convex part 15 constitutes a lower half in a tubular shape of the metal part 3, while an upper half of the metal part 3 is an open state. For this reason, the elastomer part 5 is not restricted with respect to an entire circumference thereof. As shown in an arrow Q in FIG. 3, an upper portion of the elastomer part 5 can be greatly deformed.

Moreover, in a location where the convex part 13 is provided, "up" and "down" directions are reversed from the "up" and "down" directions in the aforementioned FIG. 3; accordingly, the convex part 13 constitutes an upper half in a tubular shape of the metal part 3, while a lower half of the metal part 3 is an open state. Furthermore, in a boundary between the location where the convex part 13 is provided and a location where the convex part 15 is provided, only the continuous parts 17 exist.

That is to say, when this conductive member 1 is viewed in a cross section at any position in a line-up direction of the convex parts 13 and 15, the elastomer part 5 is enclosed with respect to either the upper half or the lower half thereof at the most. There is no position at which the elastomer part 5 is enclosed with respect to the entire circumference thereof.

Accordingly, unlike in a case where an entire circumference of the elastomer part 5 is enclosed by the metal part 3, the conductive member 1 can be smoothly deformed without causing a forced deformation of the elastomer part 5 nor applying an excessive pressing force to the elastomer part 5.

As above, although the embodiment of the present invention has been described, the present invention should not be limited to the above-described specific one embodiment. Rather, the present invention can be implemented in various forms other than the above-described embodiment.

Figure 4A:
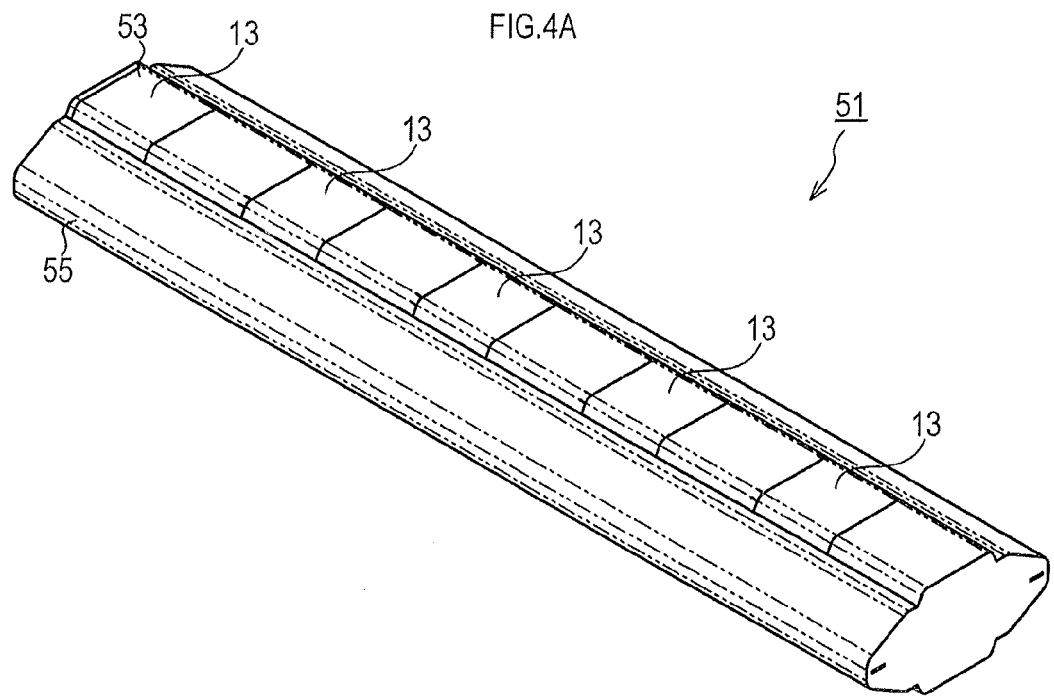
FIG. 4A is a perspective view of a conductive member shown as a modified example.
Figure 4B:
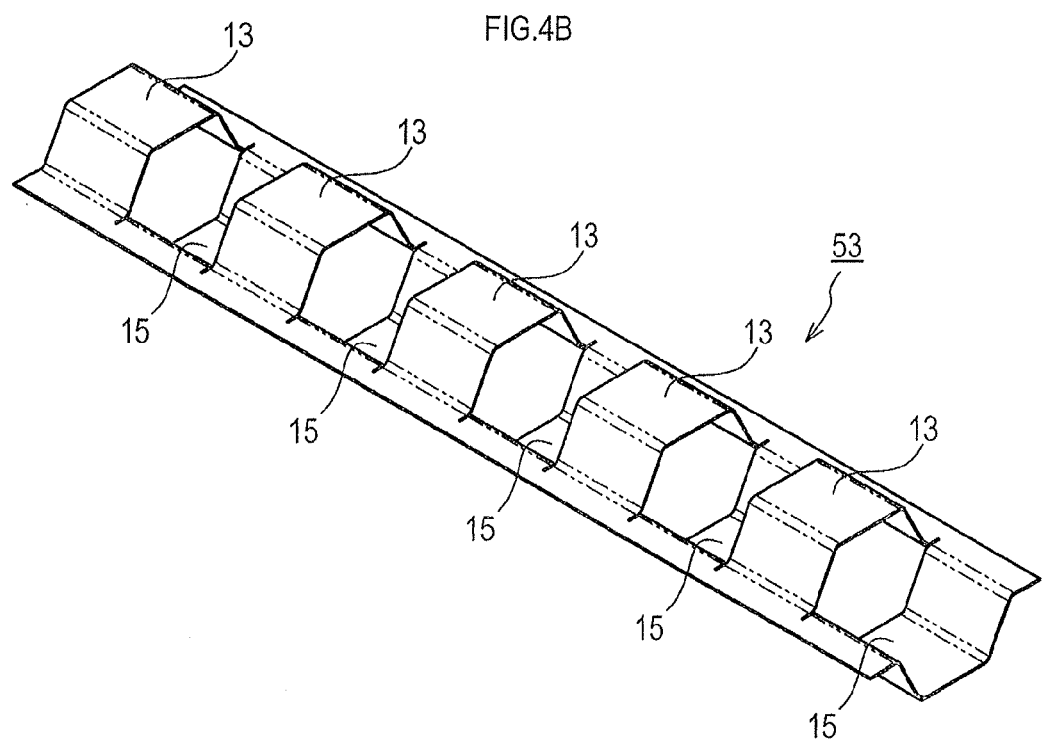
FIG. 4B is a perspective view of a metal part provided in the conductive member shown as the modified example.

For example, in the aforementioned embodiment, it is described with respect to an example in which a number of each of the convex part 13 protruding upward and the convex part 15 protruding downward is one. However, as in a conductive member 51 shown in FIGS. 4A and 4B, it may be configured such that a plurality of the convex parts 13 protruding upward and a plurality of the convex parts 15 protruding downward is provided in a metal part 53, and the metal part 53 is buried in an elastomer part 55 (in FIGS. 4A and 4B, a number of each of the convex parts 13 and the convex parts 15 is, as an example, five).

By the above-described configuration, it is possible to realize a multi-point contact structure in which electrical connection can be made at multiple points. However, the conductive member needs to be an elongated conductive member to include such multiple points. Accordingly, for facilitating size reduction, the conductive member shown in FIGS. 1A and 1B, FIGS. 2A to 2E, and FIG. 3 is preferred. The number of the convex parts may be a most appropriate number depending on purposes. Moreover, in a case where a further elongated conductive member is required, such as in a case where the conductive member is used as a gasket for electromagnetic shielding, a number of a repeated unit made up of the convex part 13 and the convex part 15 may be increased more than a number of the repeated unit of the convex part 13 and the convex part 15 in the conductive member 51 illustrated in FIGS. 4A and 4B.

In the above-described example, the number of the convex parts 13 protruding upward is equal to the number of the convex parts 15 protruding downward. However, it may be configured such that a total number of the number of the convex parts 13 and the number of the convex parts 15 is an uneven number; for example, the number of the convex parts 13 protruding upward is two, and the number of the convex parts 15 protruding downward is one.

By having a configuration as above, a position of the metallic flat-surface portion 13A or the elastomer flat-surface portion 21 to be used as the suction surface can be made in a middle area between both ends in the line-up direction of the convex parts. Therefore, a further improved stability at a time of attraction by the suction nozzle can be achieved.

Moreover, in the metal part 3 and the metal part 53 illustrated in the aforementioned embodiments, as in a metallic foil 61 shown in FIG. 5A, the slit-like through holes are formed in an elongated shape extending in a direction perpendicular to a longitudinal direction of the strip-like metallic foil. However, the through hole may be configured in other forms. For example, as in metallic foils 62 to 69 illustrated in FIGS. 5B to 5I, through holes in various forms may be considered.

Furthermore, instead of having the through holes illustrated in FIGS. 5A to 5I, a metallic foil having notches may be adopted as in metallic foils 70 to 75 illustrated in FIGS. 5J to 5O. However, in a case that the strip-like metallic foil is pulled toward the longitudinal direction thereof, the metallic foils 61 to 69 having the through holes have a higher mechanical strength than the metallic foils 70 to 75 having the notches.

Thus, it is preferable to choose whether to provide the through holes or the notches by taking into account of whether or not the aforementioned strength is required.

Moreover, as in a metallic foil 76 illustrated in FIG. 5P, a metallic foil in which both a through hole and a notch are formed may be adopted.

Furthermore, each of the above-described metallic foils 61 to 76 is configured as the strip-like metallic foil provided with the through holes or the notches. However, it may be optional whether to adopt, as a base, the metallic foil having the strip shape (a rectangular shape).

The invention claimed is:

1. A conductive member comprising:
a metal part; and
an elastomer part,
wherein the metal part is formed of a planar body of a single metallic member, the metal part including at least one upper surface-side convex part formed in the planar body so as to protrude toward a side of an upper surface of the planar body and at least one under surface-side convex part formed in the planar body so as to protrude toward a side of an under surface of the planar body,
wherein the at least one upper surface-side convex part is formed in such a manner that at least one of at least one through hole and at least one notch is formed in the planar body, a pair of portions of the planar body are respectively located on both sides where the at least one of the at least one through hole and the at least one notch is located therebetween, and one of the pair of portions is bent in a protruding manner toward the side of the upper surface of the planar body,
wherein the at least one under surface-side convex part is formed in such a manner that the other of the pair of portions of the planar body is bent in a protruding manner toward the side of the under surface of the planar body,
wherein the elastomer part includes an elastomeric material and is configured to bury therein the metal part in a state where a top end portion of the at least one upper surface-side convex part and a top end portion of the at least one under surface-side convex part are exposed to an outside of the elastomer part,
wherein the conductive member is configured such that, in a state where the conductive member is oriented such that the top end portion of the at least one upper surface-side convex part is brought into contact with a first member of a pair of members between which the conductive member is to be clamped and that the top end portion of the at least one under surface-side convex part is brought into contact with a second member of the pair of members, when the conductive member is interposed between the first member and the second member, the elastomer part is elastically deformed so that the top end portion of the at least one upper surface-side convex part is pressed toward a side of the second member and the top end portion of the at least one under surface-side convex part is pressed toward a side of the first member.

2. The conductive member according to claim 1,
wherein the at least one upper surface-side convex part and the at least one under surface-side convex part are provided to be aligned in one line when viewed from a direction perpendicular to the upper surface and the under surface of the planar body.

3. The conductive member according to claim 1,
wherein the metal part is made of a metallic foil, the metallic foil being plastically-deformed in accordance with a form of the elastomer part when the elastomer part interposed between the first member and the second member is elastically deformed.

4. The conductive member according to claim 1,
wherein each of the top end portion of the at least one upper surface-side convex part and the top end portion of the at least one under surface-side convex part is provided with a metallic flat-surface portion formed in a flat shape, and the metallic flat-surface portion of the at least one upper surface-side convex part and the metallic flat-surface portion of the at least one under surface-side convex part are parallel to each other.

5. The conductive member according to claim 2,
wherein the at least one through hole is formed in the planar body, and
wherein portions of the planar body, except for the at least one upper surface-side convex part and the at least one under surface-side convex part, form a pair of continuous parts, the pair of continuous parts being continuous with the at least one upper surface-side convex part and the at least one under surface-side convex part at both ends of the planar body in a direction intersecting an alignment direction of the at least one upper surface-side convex part and the at least one under surface-side convex part.

6. The conductive member according to claim 4,
wherein the elastomer part is provided with at least one elastomer flat-surface portion such that the at least one elastomer flat-surface portion is located on a same plane as a plane of one of the metallic flat-surface portion of the at least one upper surface-side convex part and the metallic flat-surface portion of the at least one under surface-side convex part.

7. The conductive member according to claim 4,
wherein at least one of the at least one upper surface-side convex part and the at least one under surface-side convex part is formed to include a pair of side portions formed continuously with positions on both sides where the metallic flat-surface portion of at least one of the at least one upper surface-side convex part and the at least one under surface-side convex part is located therebetween, and
wherein the pair of side portions are configured such that a part of the pair of side portions, the part being continuous with the metallic flat-surface portion, is exposed to the outside of the elastomer part, while the rest of the pair of side portions are buried in an inside of the elastomer part.

8. The conductive member according to claim 5,
wherein the conductive member is configured such that when the conductive member is interposed between the first member and the second member, the pair of continuous parts move in a direction away from each other in accordance with deformation of the metal part and the elastomer part.

9. A method for producing a conductive member, the method comprising: forming at least one of at least one through hole and at least one notch in a planar body of a single metallic member; forming at least one upper surface-side convex part in such a manner that a pair of portions of the planar body are respectively located on both sides where the at least one of the at least one through hole and the at least one notch is located therebetween, and one of the pair of portions is bent in a protruding manner toward a side of an upper surface of the planar body; forming at least one under surface-side convex part by bending the other of the pair of portions of the planar body in a protruding manner toward a side of an under surface of the planar body; and burying the planar body in an elastomeric material in a state where a top end portion of the at least one upper surface-side convex part and a top end portion of the at least one under surface-side convex part are exposed to an outside of the elastomeric material; wherein the conductive member is configured such that, in a state where the conductive member is oriented such that the top end portion of the at least one upper surface-side convex part is brought into contact with a first member of a pair of members between which the conductive member is to be clamped and that the top end portion of the at least one under surface-side convex part is brought into contact with a second member of the pair of members, when the conductive member is interposed between the first member and the second member, the elastomer part is elastically deformed so that the top end portion of the at least one upper surface-side convex part is pressed toward a side of the second member and the top end portion of the at least one under surface-side convex part is pressed toward a side of the first member.

* * * * *